US007282843B2

(12) United States Patent
Kiguchi et al.

(10) Patent No.: US 7,282,843 B2
(45) **Date of Patent: *Oct. 16, 2007**

(54) ELECTRO-OPTICAL DISPLAY HAVING AN ARRANGEMENT OF ACTIVE AND DUMMY COLORING PIXELS PERFORMING AS A COLOR FILTER ELEMENT

(75) Inventors: Hiroshi Kiguchi, Suwa (JP); Hisashi Aruga, Fujimi-machi (JP); Satoru Katagami, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 203 days.

This patent is subject to a terminal disclaimer.

(21) Appl. No.: 11/004,124

(22) Filed: Dec. 6, 2004

(65) Prior Publication Data

US 2005/0174043 A1 Aug. 11, 2005

Related U.S. Application Data

(62) Division of application No. 10/158,797, filed on Jun. 3, 2002, now Pat. No. 6,887,631.

(30) Foreign Application Priority Data

Jun. 1, 2001 (JP) ............................ 2001-167483
Jun. 1, 2001 (JP) ............................ 2001-167484

(51) Int. Cl.
*G02F 1/1335* (2006.01)
*H01J 61/38* (2006.01)
*H01J 61/40* (2006.01)

(52) U.S. Cl. ...................... 313/112; 313/110; 349/106; 349/108; 349/80

(58) Field of Classification Search ................ 313/503, 313/504
See application file for complete search history.

(56) References Cited

U.S. PATENT DOCUMENTS 5,039,204 A 8/1991 Choi
5,684,555 A 11/1997 Shiba et al.
5,844,645 A 12/1998 Kashimoto
6,031,512 A 2/2000 Kadota et al.
6,120,338 A * 9/2000 Hirano et al. ............... 313/505

(Continued)

FOREIGN PATENT DOCUMENTS

EP 0 993 235 A2 4/2000

(Continued)

OTHER PUBLICATIONS

Kiguchi H. et al., *Completion of TFD-LCDs with Color Filters by Pigment Inkjet Printing;* Asia Display/IDW'01; pp. 1745-1746.

*Primary Examiner*—Mariceli Santiago
(74) *Attorney, Agent, or Firm*—Oliff & Berridge, PLC

(57) ABSTRACT

A color filter (200) comprises pixels (13) separated from each other by partitions (14) formed on a substrate (12) so as to have a plurality of color elements of ink. Dummy pixels (13') are formed outside the area in which the pixels (13) are formed. The amount of ink applied to each of said pixels and the amount of ink applied to each of said dummy pixels are substantially equal. A protective film (21) covering said pixels (13) is formed so as to also cover said dummy pixels (13').

8 Claims, 11 Drawing Sheets

U.S. PATENT DOCUMENTS

| | | | | |
|---|---|---|---|---|
| 6,127,072 | A | 10/2000 | Shiba et al. | |
| 6,133,062 | A | 10/2000 | Pai et al. | |
| 6,145,981 | A | 11/2000 | Akahira et al. | |
| 6,376,872 | B1 | 4/2002 | Pai et al. | |
| 6,887,631 | B2 * | 5/2005 | Kiguchi et al. | 349/106 |
| 2002/0067123 | A1 * | 6/2002 | Seki et al. | 313/504 |
| 2003/0210361 | A1 | 11/2003 | Kiguchi et al. | |

FOREIGN PATENT DOCUMENTS

| | | |
|---|---|---|
| EP | 1 061 383 A1 | 12/2000 |
| JP | 06-130218 | 5/1994 |
| JP | 6-347637 A | 12/1994 |
| JP | 07-146406 | 6/1995 |
| JP | 7-294718 A | 11/1995 |
| JP | A 7-294718 | 11/1995 |
| JP | 08-075916 | 3/1996 |
| JP | A 8-201620 | 8/1996 |
| JP | A 11-271757 | 10/1999 |
| JP | 2001-188117 A | 7/2001 |

* cited by examiner (a)
301
312a
A
B
405a
405b
405
305a
306
305
302
302a
403(403R)
403(403B)
403(403G)
(b)
303
604
603
604a
605
310
311
312
412
410
411
423
314
302c
302
403B
403G
405a
405b
405
302d
302a
302b
403R
312a (a)

(b)

(c)

ELECTRO-OPTICAL DISPLAY HAVING AN ARRANGEMENT OF ACTIVE AND DUMMY COLORING PIXELS PERFORMING AS A COLOR FILTER ELEMENT

This is a division of application Ser. No. 10/158,797 filed Jun. 3, 2002 (now U.S. Pat. No. 6,887,631). The entire disclosure of the prior application is hereby incorporated by reference herein.

TECHNICAL FIELD

This invention relates to a color filter and electro-optical device, and in particular to a color filter and electro-optical device with improved uniformity between pixels in optical transmittance characteristics in each individual pixel.

BACKGROUND ART

A color filter is known to be used in color liquid crystal display devices or other display devices. Such color filter is manufactured by forming matrix-shaped partitions, functioning as shielding portions and banks, on a transparent substrate, and then using an ink jet method to apply coloring materials within the partitions, followed by baking at a prescribed temperature, drying, and hardening.

In this conventional color filter manufacturing method, when liquid material is discharged, the liquid material is applied to the extent of accumulating above the height of the partitions on the substrate. When this is baked at a prescribed temperature, dried and hardened, the volume is reduced, and the height of the coloring layer becomes substantially equal to the height of the partitions.

However, in such a color filter, if there is insufficient control of the ink surface level of the discharged ink, the volume of the ink after drying and hardening may be too large, with ink accumulated upwards beyond the height of the partitions on the substrate; or, the volume after drying and hardening may be too small, resulting in a depressed shape.

These differences in the ink surface after drying occur because, even if the quantity and density of the ink are the same, the drying conditions are different. For example, after ink discharge, if drying is performed under high-temperature conditions, the drying advances too rapidly, and there is a tendency for the ink volume to be reduced. Conversely, if dried under low-temperature conditions, the drying is too slow, and the ink volume after drying tends not to be reduced very much.

This variation in the ink surface may also occur among pixels on the same color filter substrate. In particular, variation occurs between pixels on the peripheral portion of the pixel-forming region and pixels in the center portion, and there is comparative uniformity among pixels in the center portion, excluding the peripheral portion. This is thought to be due to the fact that the drying speed in the peripheral portion of the pixel-forming region is faster than in the center portion. Such a difference in ink surface levels on the same substrate causes color irregularities and color tone differences, and is undesirable.

Such problems also occur in other electro-optical devices besides color filters. For example, it is also necessary that the light-emitting layer be formed uniformly among pixels in electroluminescence display devices, fabricated by using an ink jet method to apply an organic electroluminescence light-emitting solution.

Further, because the surfaces of coloring layers and banks are not always flat, when a protective layer is for example formed on the coloring layer and banks in fabricating a color filter, which is used in a liquid crystal display device, the surface of the protective layer may not be flat, and the distribution of the liquid crystal layer may not be flat.

Hence an object of this invention is to provide a color filter and display device in which differences in the quality (volume, surface height, surface flatness, or similar) of liquid material after drying and hardening are suppressed, so that there are no color irregularities, color tone irregularities, or light intensity irregularities.

A further object of this invention is to provide a color filter and display device in which the color filter surface is made smooth, enabling the uniform distribution of a liquid crystal layer formed on the color filter.

DISCLOSURE OF THE INVENTION

In order to resolve the above-mentioned problems, a color filter of this invention comprises pixels which are separated from each other by partitions formed on a substrate so as to comprise a plurality of color elements of ink. The light transmittance characteristics in each pixel are substantially uniform among pixels.

In the color filter, it is preferable that dummy pixels be formed on the outside of the region in which a plurality of the pixels are formed, and that the amount of ink applied to each of the pixels and the amount of ink applied to each of the dummy pixels be substantially equal.

It is also preferable that a plurality of dummy pixels are formed surrounding the area in which a plurality of pixels are formed, and that a protective film is formed so as to cover the pixels and the dummy pixels.

In the color filter, it is preferable that the amount of ink applied to the pixels and the amount of ink applied to the dummy pixels are substantially the same per unit area of the substrate.

It is preferable that the protective layer be formed so as to cover the area up to the outside of the formation area of the partitions. Also, it is preferable that the protective layer be formed so as to adhere to an exposed area of the substrate, which is outside the formation area of the partitions.

Also, a color filter of this invention is a color filter comprising a plurality of pixels which are separated from each other by partitions formed on a substrate, each comprising a color element of ink. The partitions comprise an inorganic shielding layer and an organic bank layer formed on top of the shielding layer, and the outermost portion of the bank layer is formed extending outside the outer edge of the outermost portion of the shielding layer, in contact with the substrate.

An electro-optical device of this invention comprises the above-mentioned color filter. It is preferable that the electro-optical device further comprises either a liquid crystal layer which selectively transmits light to the color filter, or a discharge display portion which selectively transmits light to the color filter.

Another electro-optical device of this invention comprises a plurality of pixels which are separated from each other by partitions formed on a substrate. Each pixel has a light-emitting layer formed by droplet discharge. The light-emission characteristics of each pixel are substantially uniform among pixels.

Electronic equipment of this invention comprises the above-mentioned electro-optical device.

Figure 1:
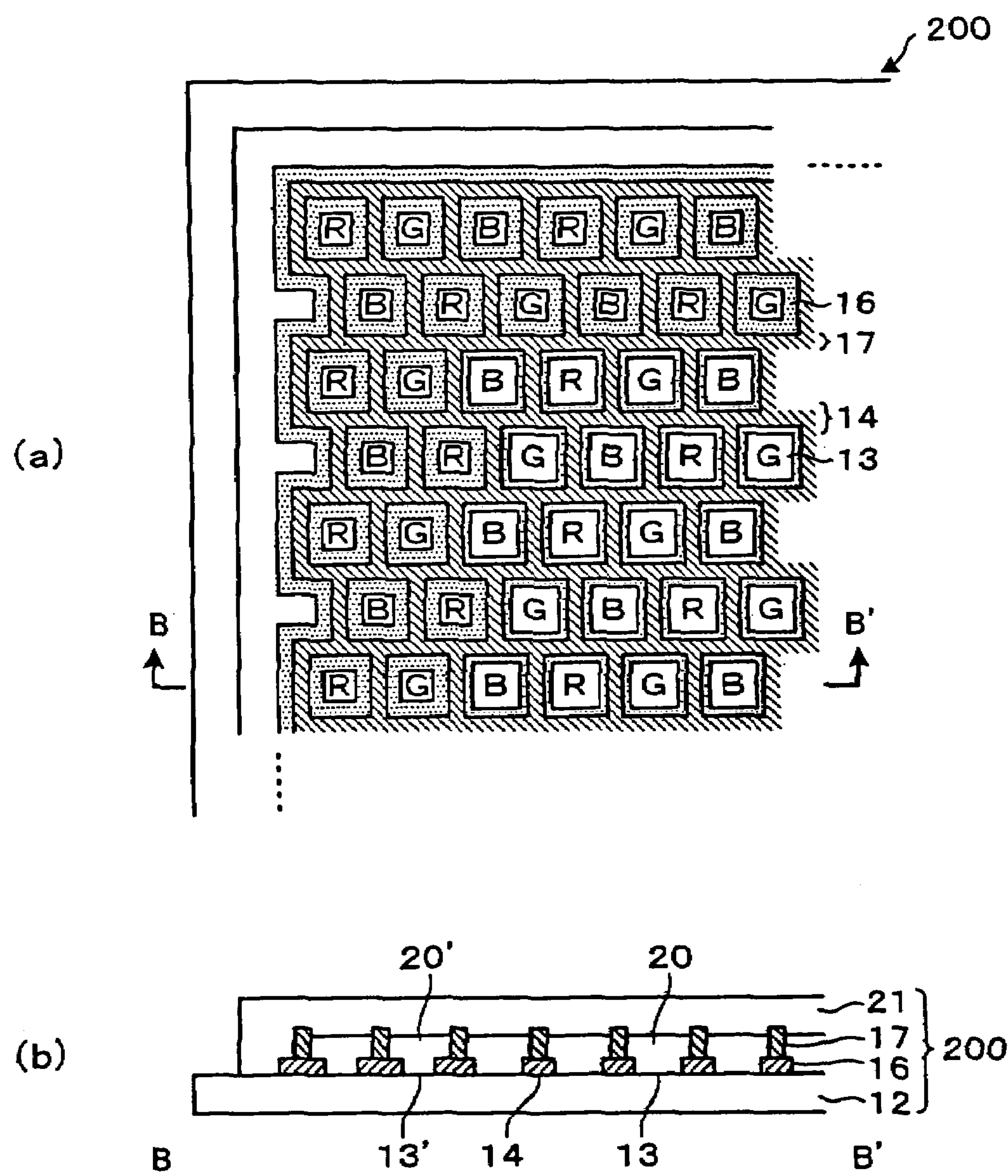
FIG. 1 is a partial enlarged view of the color filter of a first embodiment of this invention.

In these figures, the symbol 200 is a color filter; 12 is a substrate; 13 is a pixel; 13' is a dummy pixel; 14 is a partition; 20 is a coloring layer; 21 is an overcoat layer (protective film); and 300 is a liquid crystal display device (electro-optical device).

BEST MODE FOR CARRYING OUT THE INVENTION

Below, embodiments of this invention are explained, referring to the drawings.

1. Color Filter Configuration 1-1. First Embodiment

FIG. 1 is a partial enlarged view of a color filter of a first embodiment of this invention. FIG. 1(*a*) is a plan view, and FIG. 1(*b*) is a cross-sectional view along line B-B' in FIG. 1(*a*).

As shown in FIG. 1(*a*), the color filter 200 comprises pixels 13 arranged in a matrix on the transparent substrate 12; the boundaries between the pixels are divided by partitions 14. Into each of the pixels 13 is introduced an ink in one of the colors red (R), green (G), and blue (B). In this example, the colors red, green, and blue are arranged in a so-called mosaic array. However, other arrangements, such as a stripe array or a delta array, may be used.

As shown in FIG. 1(*b*), the color filter 200 comprises a transparent substrate 12 and light-shielding partitions 14. The pixels 13 are formed in portions in which the partitions 14 are not formed (are removed). The inks of different colors introduced into the pixels 13 constitute the coloring layer 20. An overcoat layer (protective film) 21 is formed on the upper surfaces of the partitions 14 and the coloring layer 20.

The partitions 14 comprise a shielding layer 16 and a bank layer 17. The shielding layer 16 is formed in a prescribed matrix pattern on the substrate 12. The shielding layer 16 needs to have sufficient shielding properties and ability to function as a black matrix, and may comprise a metal, resin, or similar. As the material for the shielding layer 16, in light of the fact that sufficient and uniform shielding properties are obtained at a small film thickness, it is desirable that a metal material be used. No constraints in particular are placed on the metal used as the shielding layer 16, and the metal material can be selected with consideration to the efficiency of all processes used, including film deposition and photo-etching. As a metal material, it is preferable that chromium, nickel, aluminum, or other metals used in electronic device processes be employed. When a metal material is used in the shielding layer 16, sufficient shielding properties are obtained if the film thickness is 0.1 μm or greater. When considering adhesion properties, brittleness, and other factors of the metal layer, it is desirable that the film thickness be 0.5 μm or less.

The bank layer 17 is formed on the shield layer 16, and has a prescribed matrix pattern. This bank layer 17 divides the portions in which the coloring layer is formed, to prevent the intermixing of colors (color blending) of adjacent coloring layers. Hence the film thickness of the bank layer 17 is set according to the height of the ink layer, such that the ink injected as the colorant when forming the coloring layer 20 does not overflow. From this standpoint, it is preferable that the bank layer 17 be formed with a film thickness in the range of, for example, 1 μm to 5 μm.

In this planar pattern, the bank layer 17 is formed to be smaller than the shielding layer 16. That is, the bank layer 17 is formed such that the shielding layer 16 is exposed at the edges by a prescribed amount.

The bank layer 17 comprises a resin which can be shaped using photolithography. This photosensitive resin layer need not necessarily have a large contact angle with water and excellent water-repellent properties, or have light-shielding properties, but can be selected from among a wide range of materials. As the resin comprised by the bank layer 17, for example, a photosensitive resin compound containing urethane resin, acrylic resin, novolac resin, Cardo resin, polyimide resin, polyhydroxy styrene, polyvinyl alcohol, or similar can be used.

The coloring layer 20 is formed on the exposed surface of the shielding layer 16 as well as on the exposed surface of the substrate 12. The portion formed on the exposed surface of the substrate 12 (transparent portion) effectively functions as a coloring layer. In the portion of the shielding layer 16 positioned on the exposed surface (non-transparent portion), light from above or below the substrate 12 is blocked by the shielding layer 16, and is not transmitted.

In this way, by forming a non-transparent portion in the peripheral portion of the coloring layer 20, the film thickness in the transparent portion of the coloring layer can be made uniform. As a result, color irregularities arising from partial differences in the film thickness of the coloring layer can be prevented. The reason for this is as follows. The peripheral portion of the coloring layer 20, that is, the portion in contact with the bank layer 17, has a film thickness smaller than, or larger than, other portions, due to the wetting properties of ink on the surface of the bank layer 17 and to other factors. Hence it is quite difficult to cause the coloring layer 20 to be distributed in a uniform film thickness over the entirety of the coloring layer 20. However, according to this embodiment, the peripheral portion of the coloring layer 20, the film thickness of which is particularly difficult to make uniform, is formed to overlap a portion of the shielding layer 16. Therefore, the peripheral portion, the film thickness of which is difficult to control, can be made as a non-transparent portion. As a result, the portions in which the film thickness is not uniform, which are a cause of color irregularities and other problems, can be removed from the transparent portion.

Hence it is desirable that the width of the exposed surface of the shielding layer 16 be set by taking into consideration of the wetting properties of the ink with respect to the bank layer 17, the effective area of the transparent portion, the relation between the ink volume and the film thickness, lower limitations to the width of the bank layer, the ink impact precision, and similar. The width may be set to, for example, 1 μm to 10 μm, and more preferably 2 μm to 3 μm.

As explained above, the exposed surface of the shielding layer 16 is preferably formed to cover the portion in which the coloring layer 20 has a non-uniform film thickness. Therefore, it is desirable that the exposed surface of the shielding layer 16 be formed continuously along the periphery of the coloring layer 20, that is, in a ring shape along the periphery of the shielding layer 16.

In this embodiment, the periphery of the bottom surface of the bank layer 17 is positioned further inside than the periphery of the shielding layer 16; that is, the outer face of the bank layer 17 recedes from the outer face of the shielding layer 16. Therefore, a step is formed on the shielding layer 16. As explained below, this step has the function of preventing the inflow of ink into the transparent portion of the neighboring coloring layer. As a result, color mixing in the coloring layer can be suppressed.

In the color filter 200, a plurality of dummy pixels 13' comprising coloring layer but not functioning as a display element is formed in the circumferential area outside the pixel formation area in which are formed a plurality of pixels 13 functioning as pixels. The dummy pixels 13' are a portion in which an active matrix element is not formed in the corresponding portion of the opposing substrate 38, described below. In order to render uniform the coloring material in the pixel 13 after drying, and to render substantially uniform among pixels the light transmittance properties in each pixel, the dummy pixels 13' comprise a coloring layer 20' provided with the same amount of coloring material as the coloring layer 20 of a pixel 13.

As shown in the figure, the dummy pixels 13' have a larger exposed surface of the shielding layer 16 compared with other pixels 13, that is, the exposed surface of the glass substrate 12 (the aperture portion) is smaller. This enables easy differentiation from normal pixels 13. The bank layer 17 surrounding the dummy pixels 13' is configured similarly to the bank layer 17 surrounding other pixels 13, and the thickness of the shielding layer 16 is significantly thin compared with the thickness of the bank layer 17. Therefore, the volumes of the ink which can be accepted by a pixel 13 and by a dummy pixel 13' are substantially the same. Further, a pixel density of dummy pixels 13' is the same as that of ordinary pixels 13. Dummy pixels 13' are formed in the peripheral portions on the substrate, for example, over an area of ten pixel columns (for simplicity, in the figure, two columns of dummy pixels are shown).

The overcoat layer 21 covers not only the pixels 13, but the dummy pixels 13' also. As a result, the overcoat layer 21 has a flat upper surface, and can render the distribution of the liquid crystal layer uniform, as well as rendering the pixel light transmittance characteristics among pixels substantially uniform.

In the above-described first embodiment, it was stated that aperture portions are formed also in the dummy pixels 13'; however, it is not always necessary that aperture portions be formed in the dummy pixels 13'.

1-2. Second Embodiment

Figure 2:
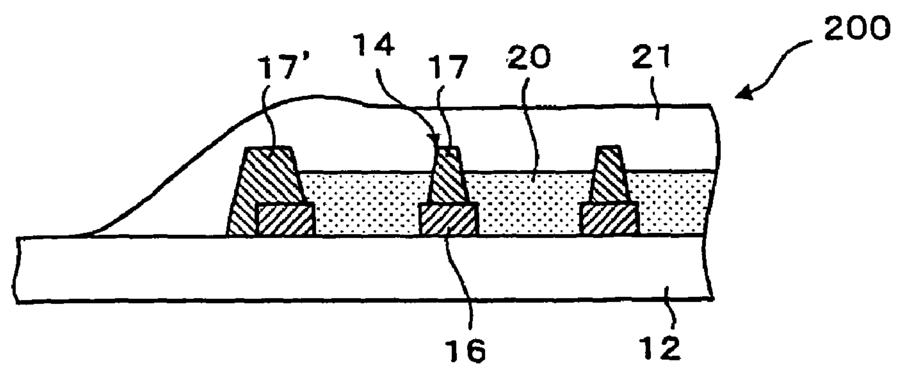
FIG. 2 is a partial cross-sectional view of a modification of the color filter of FIG. 1.

FIG. 2 is a partial cross-sectional view of a modification of the color filter of FIG. 1. This color filter comprises partitions 14; the partitions 14 are similar to those of the example of FIG. 1 in that a bank layer 17 is formed on top of a shielding layer 16, but the cross-sectional shape of the outermost portion 17' of the bank layer 17 comprised by the partitions 14 differs from the example of FIG. 1.

In particular, the outermost portion 17' of the bank layer 17 is formed with a greater width than the other portions of the bank layer 17, and has a portion extending outside the outermost portion of the shielding layer 16 and in direct contact with the substrate 12. As a result, the overcoat layer 21 and shielding layer 16 are isolated, and are in a state of mutual non-contact.

When forming the bank 17 of resin, because the outermost portion 17' is formed with a greater width, the heat capacity of the outer portion can be increased. Hence when drying and baking the coloring layer 20, sudden thermal changes in the coloring layer 20 positioned near the outside of the pixel formation area can be suppressed. By this means, the quality after drying of the coloring layers 20 can be rendered uniform between the coloring layers neighboring the edge of the pixel formation area and the coloring layers in the central portion of the pixel formation area, and the optical properties can be made uniform among pixels.

In the example of FIG. 1, there is a tendency for the slope of the edge portion of the overcoat layer 21 to be steep, and it is sometimes difficult to control the shape. This is thought to occur because, in FIG. 1, the overcoat layer 21 is in contact with the shielding layer 16 on the outermost partitions 14, so that the wetting properties for the overcoat layer 21 are better for the shielding layer 16 than for the bank layer 17. However, in the example of FIG. 2, the overcoat layer 21 is not in contact with the shielding layer 16 on the outermost partitions 14, so that no such problem occurs, and the slope of the overcoat layer 21 can be made gentle.

2. Electro-Optical Device

Figure 3:
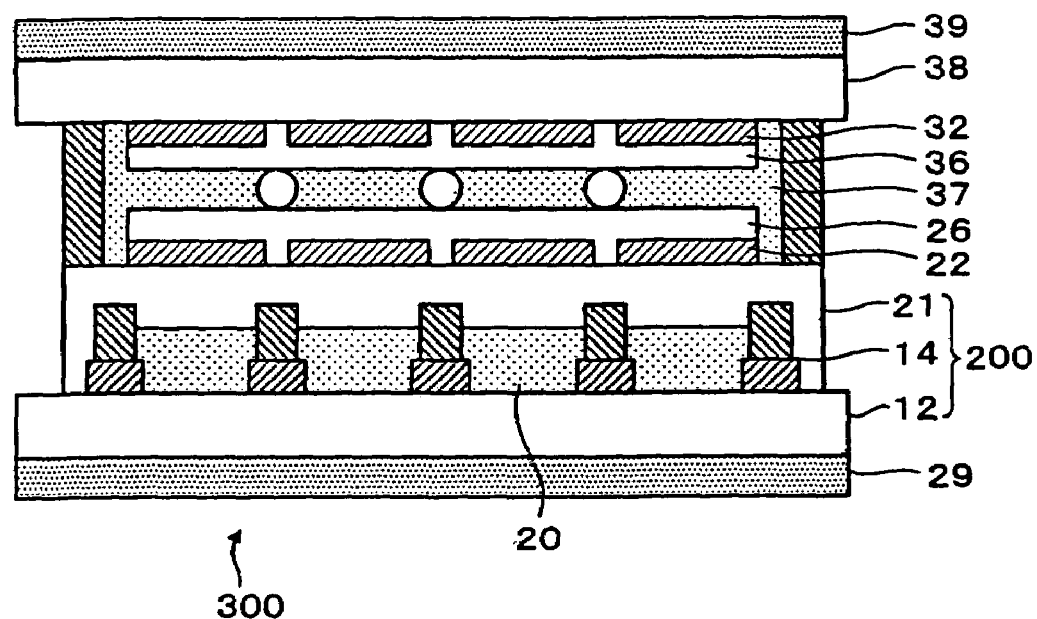
FIG. 3 is a cross-sectional view of a color liquid crystal display, which is an electro-optical device of the first embodiment of this invention.

FIG. 3 is a cross-sectional view showing a display device, which is an electro-optical device of the first embodiment of this invention. Here an explanation is given for a color liquid crystal display device. This color liquid crystal display device 300 uses the above-mentioned color filter 200, so that drying and hardening of the coloring material are performed under conditions that are uniform among pixels, and therefore the film thickness of the coloring material in each pixel after drying and hardening is uniform among pixels. Further, this color liquid crystal display device 300 uses the above-mentioned color filter 200, so that the overcoat layer 21 is flat, and consequently the liquid crystal layer 37 is uniformly distributed. As a result, this liquid crystal display device 300 has pixel light emission characteristics that are substantially uniform among pixels, and so images can be displayed with good image quality.

This color liquid crystal display device 300 is configured by combining the color filter 200 with an opposing substrate 38, and injecting a liquid crystal composition 37 between them. TFT (thin film transistor) elements or TFD (thin film diode) elements (not shown), as well as pixel electrodes 32, are formed in a matrix shape on the inside surface of the opposing substrate 38 in the liquid crystal display device 300. The color filter 200 is positioned as another substrate, with the pixel electrodes 22 positioned opposing the pixel electrodes 32, and with red, green, and blue coloring layers 20 in an array.

Alignment films 26, 36 are formed on the opposing surfaces of the opposing substrate 38 and the color filter 200.

These alignment films 26, 36 are subjected to rubbing processing, and can align the liquid crystal molecules in a fixed direction. Also, polarizing plates 29, 39 are bonded to the outer faces of the opposing substrate 38 and of the color filter 200. As a backlight, a combination of a fluorescent light (not shown) and a scattering plate is generally used; display is performed by causing the liquid crystal composition 37 to function as an optical shutter which changes the transmittance ratio of light from the backlight.

3. Method of Manufacture of a Color Filter and Electro-Optical Device

Figure 4:
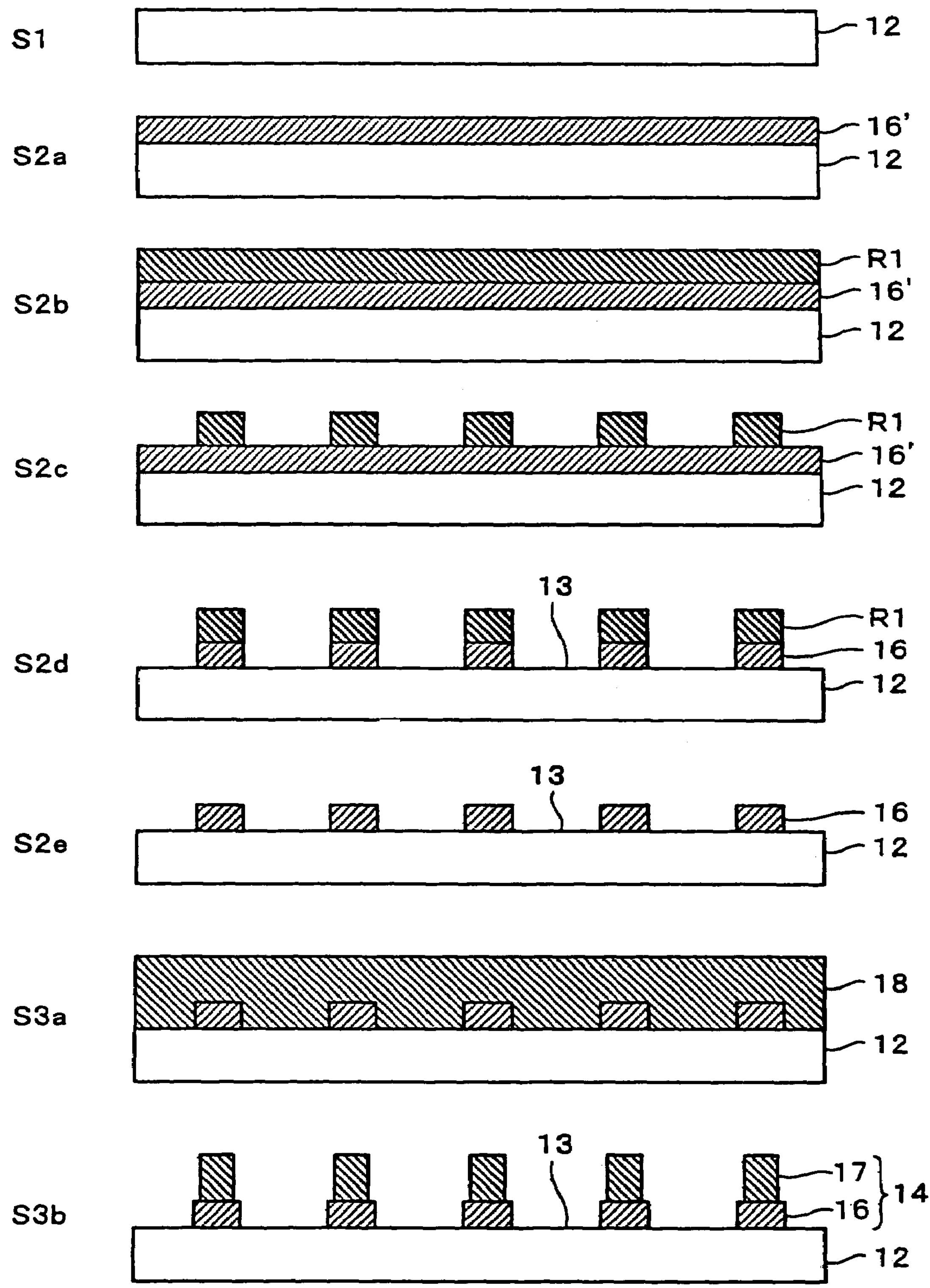
FIG. 4 is a cross-sectional view of manufacturing processes for the color filter.
Figure 5:
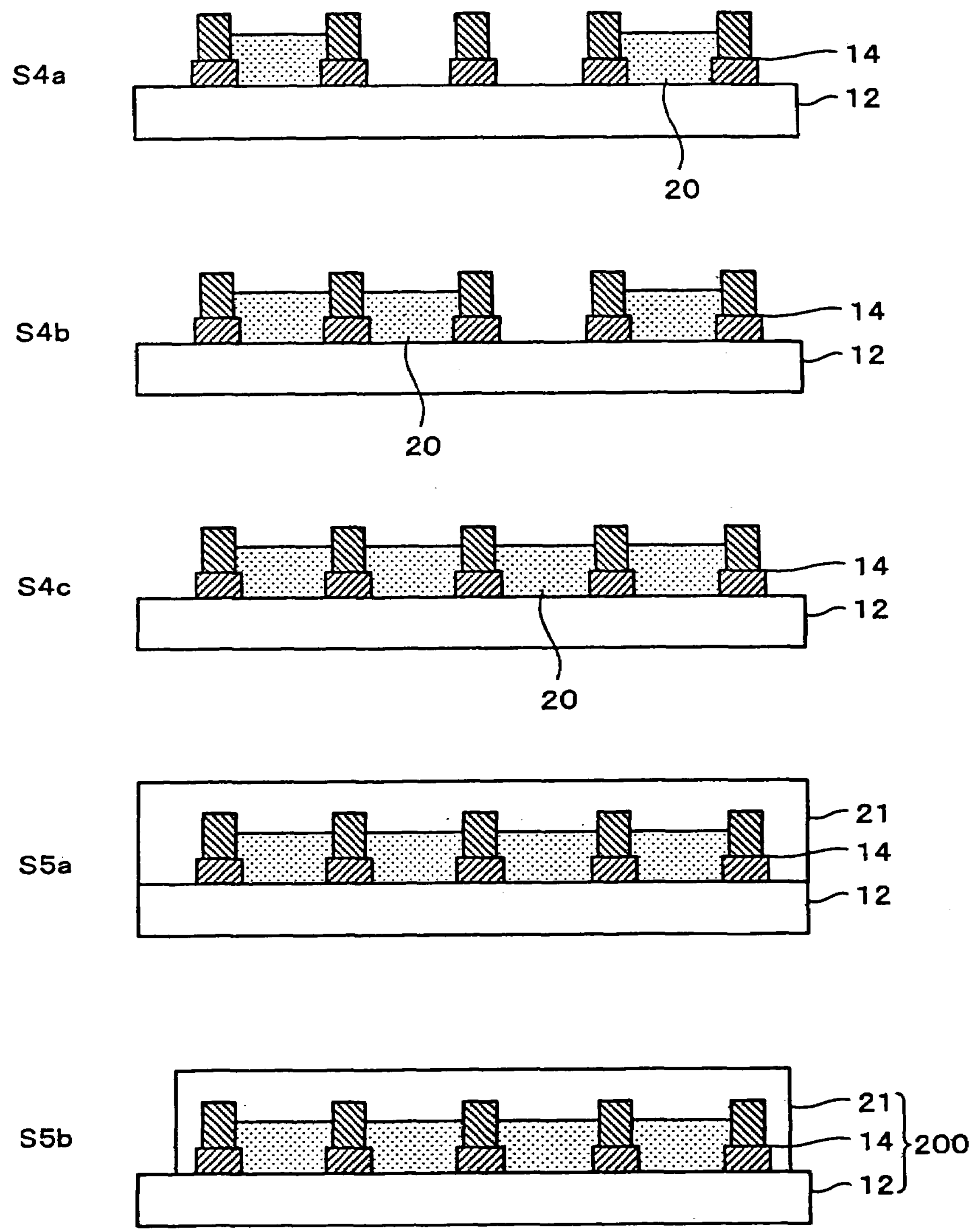
FIG. 5 is a cross-sectional view of manufacturing processes for the color filter.

FIGS. 4 and 5 are cross-sectional views of manufacturing processes of the color filter. Based on these figures, one example of a color filter manufacturing method is explained in detail.

3-1. Cleaning Process

A flat transparent substrate of non-alkaline glass, of thickness 0.7 mm and measuring 38 cm high and 30 cm wide, is prepared as the substrate 12 (S1 in FIG. 4). The transparent substrate 12 is subjected to ultrasonic cleaning in an alkaline solution, and after rinsing in pure water, is air-dried at 120° C. to obtain a clean surface. It is desirable that this transparent substrate 12 withstands 350° C. heat, be not easily attacked by acids, alkalis or other chemical agents, and be mass-producible. As the material for the transparent substrate 12, in addition to glass substrate, plastic film or plastic sheet can also be used.

3-2. Black Matrix Patterning Process 3-2a. Cr Layer Sputtering

A metal layer 16' comprising a chromium film is obtained on the surface of the substrate 12 by sputtering (S2*a* in FIG. 4). Specifically, a chromium target is used to perform reactive sputtering, depositing Cr onto $Cr_2O_3$. The total film thickness of the $Cr_2O_3$ and Cr is on average 150 nm. By including an intervening $Cr_2O_3$ film, the adhesion of the Cr layer to the substrate is improved. This metal layer 16' is patterned into prescribed block areas by a process described below, and functions as a black matrix comprising aperture portions. In addition to chromium, such other materials as nickel, tungsten, tantalum, copper, or aluminum may be used as the black matrix material.

3-2b. Photoresist Coating

After drying this substrate on a hot plate at 80° C. for 5 minutes, a positive-type photoresist layer R1 is formed on the surface of the metal layer 16' (S2*b* in FIG. 4). For example, the photoresist OFPR-800 (manufactured by Tokyo Ohka Kogyo Co., Ltd.) is spin-coated at 2000 rpm to 3000 rpm to form the layer. The film thickness of the resist layer is 1.7 μm. The photo-resist layer formed on the substrate is dried for 5 minutes at 80° C. on a hot plate.

3-2c. Exposure to Light and Development

A mask film patterned into a desired matrix pattern is formed to adhere closely to the surface of the photoresist layer R1, and exposure to ultraviolet rays is performed. Next, this is immersed in an alkaline developing solution containing 8% potassium hydroxide by weight, and the photoresist in the unexposed portions is removed, to pattern the resist layer R1 (S2*c* in FIG. 4). The pattern of the aperture portions is selected appropriately from among a mosaic array, delta array, stripe array, or similar. The shape of the aperture portions need not be rectangular, but may also be circular, in keeping with the shapes of the ink drops.

3-2d. Chromium Etching

Next, the exposed metal layer 16' is removed by etching using an etching solution the principal component of which is hydrochloric acid, to form the aperture portions of the pixels 13 (S2*d* in FIG. 4).

3-2e. Photoresist Stripping

The resist pattern obtained from resist development is stripped from the chromium film by chemical processing using an organic stripper, or by ashing processing using oxygen plasma or similar, to expose the chromium pattern formed in blocks to the substrate surface. In this way, a shielding layer (black matrix) 16 having a prescribed matrix pattern can be obtained (S2*e* in FIG. 4). The width of the shielding layer 16 is approximately 20 μm.

In the outer circumference of the pixel formation area are formed approximately ten columns of the above-described dummy pixels 13', which do not contribute to the image display, as explained in FIG. 1. In the dummy pixels 13', the width of the shielding layer 16 is greater than the above-mentioned value, and the area of the aperture portion is reduced.

3-3. Bank Patterning Process 3-3a. Bank Material Coating

A negative-type transparent acrylic photosensitive resin composition 18 is applied onto the substrate, again using spin coating at 2000 rpm to 3000 rpm (S3*a* in FIG. 4).

3-3b. Exposure to Light and Development

After pre-baking this photosensitive resin composition 18 at 100° C. for 20 minutes, a mask film on which is drawn a prescribed matrix pattern is used to perform ultraviolet ray exposure. The resin in the unexposed portions is developed using an alkaline developing solution, and after rinsing with pure water is spin-dried. As a final drying process, final baking is performed for 30 minutes at 200° C., to sufficiently harden the resin portion; by this means the bank layer 17 is formed, and partitions 14 comprising the shielding layer 16 and the bank layer 17 are obtained (S3*b* in FIG. 4). The role of this bank layer 17 is, as banks, to partition each of the pixels 13 to which ink is to be applied, so as to prevent the blending of inks in adjacent pixels 13. The film thickness of this bank layer 17 is on average 2.5 μm. The width of the bank layer 17 is approximately 14 μm.

3-3c. Surface Treatment

By subjecting the substrate 12 and partitions 14 to plasma treatment as described below, the substrate 12 is endowed with an affinity for the ink, and the partitions 14 are endowed with ink-repelling properties. The upper portion (bank layer 17) of the partitions 14 comprise an insulating organic material, and the substrate 12 comprises glass or some other inorganic material, so that by introducing a gas containing a fluoride compound and performing plasma treatment of the substrate surface, the above-mentioned effect is obtained. Specifically, in capacitive-coupled type plasma processing, the introduced gas is passed through a reaction chamber, and one electrode is connected to the substrate 12, while the other electrode is opposed to the surface of the substrate 12, and a voltage is applied.

First, plasma treatment is performed for from 10 seconds to 300 seconds with oxygen ($O_2$) introduced at a gas flow rate of 500 SCCM, at a power of 0.1 $W/cm^2$ to 1.0 $W/cm^2$, and at a pressure of 1 Torr or less. In this process, ashing of the aperture portions of the pixels 13 is performed, and by activating the substrate 12 with surface exposed, it is given an affinity with ink.

Next, carbon fluoride ($CF_4$) gas is introduced at a flow rate of 900 SCCM, and plasma treatment is performed at a power of 0.1 $W/Cm^2$ to 1.0 $W/cm^2$, and at a pressure of 1 Torr or less, for 600 seconds to 3600 seconds. By means of this process, the surface energy of the bank layer 17 can be lowered, so that ink is more easily repelled. Hence while maintaining the affinity of the surface of the substrate 12 for ink, the bank layer 17 can be rendered ink-repelling semi-permanently.

When using a fluoride compound gas for plasma treatment, in addition to carbon fluoride ($CF_4$), nitrogen fluoride ($NF_3$) and sulfur fluoride ($SF_6$) can also be used. Also, once the bank layer 17 is activated by the oxygen plasma, it can also be returned to its original ink-repelling properties through heat treatment.

By means of the above-mentioned surface treatment, the substrate surface can be improved; in particular, it is preferable that the contact angle between ink and bank layer 17 be set to between 30 degrees and 60 degrees, and that the contact angle between ink and substrate 12 be set to less than 30 degrees.

3-4. Coloring Layer Formation Process 3-4a. Ink Introduction

An ink jet method is used to introduce the ink that is the coloring material into each of the pixels 13 and dummy pixels 13' in which the aperture portions have been formed, to color the pixels and the dummy pixels red (R), green (G) or blue (B) (S4*a*, 4*b*, 4*c* in FIG. 5). Because the upper portion of the partitions 14 is treated so as to have ink-repelling properties, overflowing of the banks by the inks to flow into adjacent aperture portions or spreading of ink can be prevented.

As the ink jet recording head, a precision head using the piezoelectric effect is employed, to selectively discharge ten droplets, each droplet a minute amount of approximately 7.0 pico-liters, into each coloring layer formation portion. The driving frequency is 14.4 kHz, that is, the discharge interval for each ink droplet is set to 69.5 μsec. The distance between head and target is set to 0.3 mm. In addition to the physical properties of the ink, the voltage driving the piezoelectric element of the head and the driving waveform are also important in controlling the velocity of ink discharged from the head to the coloring layer formation portion which is the target, and in preventing the curvature of the trajectory and the occurrence of errant divided droplets called satellites. Hence the waveform to be set as a condition in advance is programmed, and ink droplets in the three colors red, green, blue are discharged, to apply the ink in the prescribed color pattern.

In this way, when a plurality of types of ink (red, green, blue) are introduced into different pixels on the same substrate, three types of ink may be applied simultaneously; or, the first type of ink may be introduced into prescribed pixels on the substrate and baked, after which the second ink is introduced into prescribed pixels other than the pixels into which the first ink was introduced and is baked, and finally the third ink is introduced.

As the ink, for example, after dispersing an inorganic pigment in a polyurethane resin oligomer, cyclohexane and butyl acetate are added as low-boiling-point solvents, and butyl carbitol acetate is added as a high-boiling-point solvent, 0.01 weight percent of a non-ionic surfactant is added as a dispersant, and the viscosity is adjusted to 6-8 centipoises.

In this embodiment, the side faces of the bank layer 17 are receded from the side faces of the shielding layer 16, so that a step is formed on the shielding layer. Consequently when the ink layer is formed in the coloring layer formation portion, even if a portion of the ink layer were to overflow the bank layer, this ink would remain on the step comprising the exposed surface of the shielding layer and the side face of the bank layer, and flowing onto the exposed surface of the substrate in adjacent coloring layer formation portions would be prevented. As a result, the occurrence of color blending in the coloring layer resulting from intermixing of inks can be prevented.

Here, ink is applied in the same quantity as normal pixels to the dummy pixels 13' which do not contribute to the image display. Because the pixel density of the dummy pixels 13' is the same as that of normal pixels 13, the amount of ink applied per unit area of the substrate is also the same. Consequently, drying conditions for the ink applied to pixels in the color filter can be made uniform.

3-4b. Drying Process

Next, the applied ink is dried. The coloring layer 20 is first left for three hours in a natural environment for being set, and is then heated for 40 minutes on a hot plate at 60° C. When the three colors red, green and blue are applied in sequence and not simultaneously (S4*a*, 4*b*, 4*c* in FIG. 5), this pre-baking operation is performed for each applied ink color.

Finally, heating for 30 minutes at 200° C. in an oven is performed to harden the coloring layer 20, thereby obtaining a coloring layer 20 of thickness 1.0 μm.

3-5. Overcoat Layer Formation Process 3-5a. Coating

When drying is completed, an overcoat layer 21 is formed on the color filter substrate on which the ink film was formed (S5*a* in FIG. 5). This overcoat layer 21 has the role of smoothing the filter surface. In forming the overcoat layer 21, a spin coating method, roll coating method, dipping method, ink jet method, or other method can be applied. For example, spin coating at 2000 rpm to 3000 rpm is applied. The overcoat layer is formed so as to cover the entirety of the pixels 13 and partitions 14, and to have a height of 2 μm to 3 μm from the substrate 12. As the composition of the overcoat layer 21, a photo-hardening resin, heat-hardening resin, dual photo-hardening/heat-hardening resin, or an inorganic material formed by evaporation deposition, sputtering, or some other means, can be used, so long as subsequent ITO formation processes, alignment layer formation processes and similar can be withstood, in consideration of the transparency required for use as a color filter.

This overcoat layer 21 is formed so as to cover the dummy pixels 13' as well, so that the entire surface of the overcoat layer 21 is flat, and the distribution of the liquid crystal layer can be rendered uniform.

Moreover, the adhesion of the overcoat layer 21 to the bank layer 17 of the partitions 14, which have been subjected to water-repelling treatment, is reduced. Hence it is desirable that the overcoat layer 21 be formed so as to extend to the substrate 12 exposed on the outside of the pixel formation area, as shown in the figure. By this means, the overcoat layer 21 can be made to adhere strongly to the substrate 12, and stripping of the overcoat layer 21 can be prevented.

3-5b. Exposure to Light and Development

After the overcoat layer 21 is spin-coated, exposure to light and development are performed and the portion of the overcoat layer 21 at the periphery of the substrate is removed (S5*b* in FIG. 5). Terminal lead portions are later formed where the layer was removed.

3-5c. Heat Treatment

Next, in order to dry the overcoat layer 21, it is heated to a prescribed temperature (for example, 220° C.) for a prescribed length of time (for example, 60 minutes), to obtain the color filter 200.

3-6. ITO Formation Process

Figure 6:
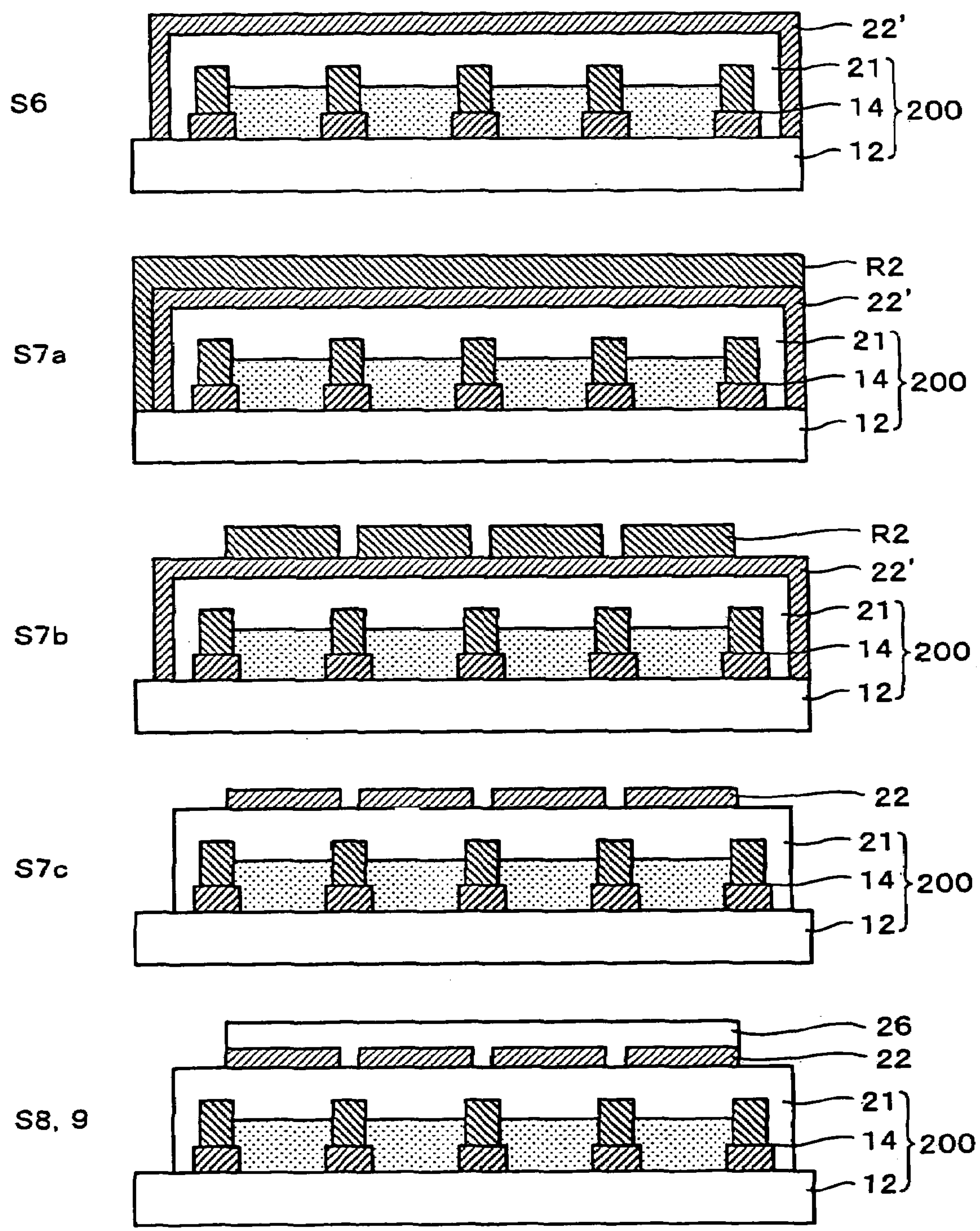
FIG. 6 is a cross-sectional view of manufacturing processes for the color liquid crystal display.
Figure 7:
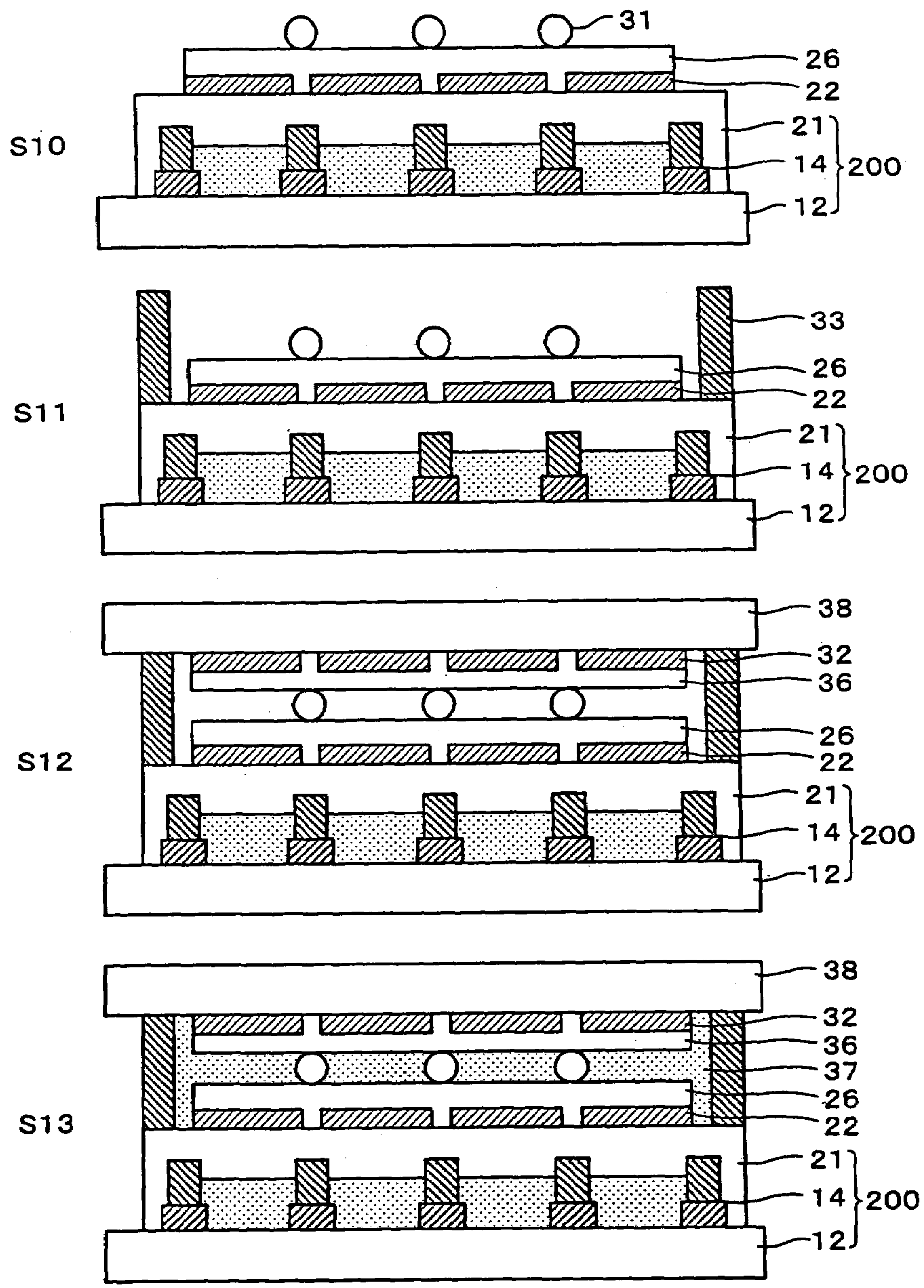
FIG. 7 is a cross-sectional view of manufacturing processes for the color liquid crystal display.

FIGS. 6 and 7 are cross-sectional views of a manufacturing process for the color liquid crystal display device.

An ITO (Indium Tin Oxide) layer 22' which will become an electrode layer is formed, to a thickness of 300 nm over the entire upper surface of the overcoat layer 21 of the color filter 200, using sputtering, evaporation deposition, or some other well-known method (S6 in FIG. 6). Further, reactive sputtering is used to form an insulating layer (not shown) comprising $SiO_2$ on the ITO, to a thickness of 10 nm.

Similar processes are performed not only for the color filter 200, but for the opposing substrate 38, on which are formed TFTs (thin film transistors), TFDs (thin film diodes), or some other active matrix elements, to form an electrode layer 32 of ITO and an insulating film of $SiO_2$ (not shown).

3-7. ITO Etching Process 3-7a. Photoresist Coating

Next, photolithography is performed for the ITO layer 22' and insulating film. In this photolithography process, first a resist R2 is spin-coated at 2000 rpm to 3000 rpm onto the entire surface of the $SiO_2$/ITO film formed on the substrate, applied to a thickness of 1.7 μm (S7*a* in FIG. 6).

3-7b. Exposure to Light and Development

Then, a photomask is used for exposure, development is performed, and a resist mask is formed (S7*b* in FIG. 6).

3-7c. Etching and Resist Stripping

Next, etching of the $SiO_2$/ITO film is performed using the resist mask R2 as a mask, and after patterning the pixel electrodes 22, an alkaline solution is used to strip and remove the resist mask (S7*c* in FIG. 6).

3-8. Alignment Film Formation Process

Next, an alignment film 26 is formed on the surface of the substrate. The alignment film 26 is formed by, for example, flexo-graphic printing of a polyimide or similar to a thickness of 75 nm, followed by baking at 190° C. (S8, 9 in FIG. 6). A similar process is performed for the opposing substrate 38 as well as the color filter 200, to form the alignment film 36 (not shown).

3-9. Rubbing Process

Next, by uniaxial alignment (rubbing) treatment of the alignment films, the liquid crystal molecules to be injected later can be aligned in a fixed direction.

3-10. Spacer Dispersion

Following this, spacers 31 are dispersed on the alignment film 26 (S10 in FIG. 7). The spacers used have a diameter of 3.5 μm.

3-11. Sealant Printing Process

Then, sealant 33 is printed onto the peripheral portion of the overcoat layer 21 (S11 in FIG. 7). In this sealant printing process, an opening is formed in a portion of the sealant 33, as an inlet for liquid crystal injection. Screen printing or some other techniques can be used for this sealant printing. After printing the sealant 33, baking is performed at a temperature of 160° C.

3-12. Assembly Process

Next, the color filter 200 and the opposing substrate 38 are brought to be faced and bonded with each other (S12 in FIG. 7).

The panel bonded in this way is cut into pieces each having a strip shape. As a result of this cutting process to the strip shape, portions each of which later becomes a liquid crystal panel after separation are connected in one row to form the strip shape.

3-13. Liquid Crystal Injection Process

Next, liquid crystals 37 are injected into the gaps in the strip shape panels (the gap between the color filter substrate 200 and the opposing substrate 38) (S13 in FIG. 7). In this injection and sealing process, the panels are placed in a prescribed position within the processing chamber of the liquid crystal injection equipment. Then, the processing chamber is evacuated, so that there is a vacuum in the gap enclosed by the color filter 200 and the opposing substrate 38. Then, a container in which are held liquid crystals is moved, so that the liquid crystal injection inlets are submerged within the liquid crystals in the container. In this state, the processing chamber is returned to atmospheric pressure, breaking the state of vacuum, and the gap enclosed by the color filter 200 and the opposing substrate 38 remains in a state of vacuum, so that the liquid crystals are sucked into the gaps through the liquid crystal injection inlets.

When this injection of the liquid crystals 37 is completed, each of the liquid crystal injection inlets is sealed with a sealant comprising an ultraviolet ray hardening resin. After completing the liquid crystal injection and sealing processes, any liquid crystals adhering to the strip-shaped panel are cleaned.

Next, the strip-shaped panel is cut into individual liquid crystal panels. The individual liquid crystal panels are then cleaned to remove glass powder and other impurities adhering to the individual liquid crystal panels.

Then, polarizing plates 29 and 39 are bonded to the outer surfaces of the color filter 200 and the opposing substrate 38, as shown in FIG. 3.

Following this, in a final inspection process, a prescribed inspection signal is supplied via a flexible wiring board, and inspections of the complete or partial lighting of each pixel are performed, to complete the liquid crystal display device 300.

4. Electroluminescence Display Device

Figure 8:
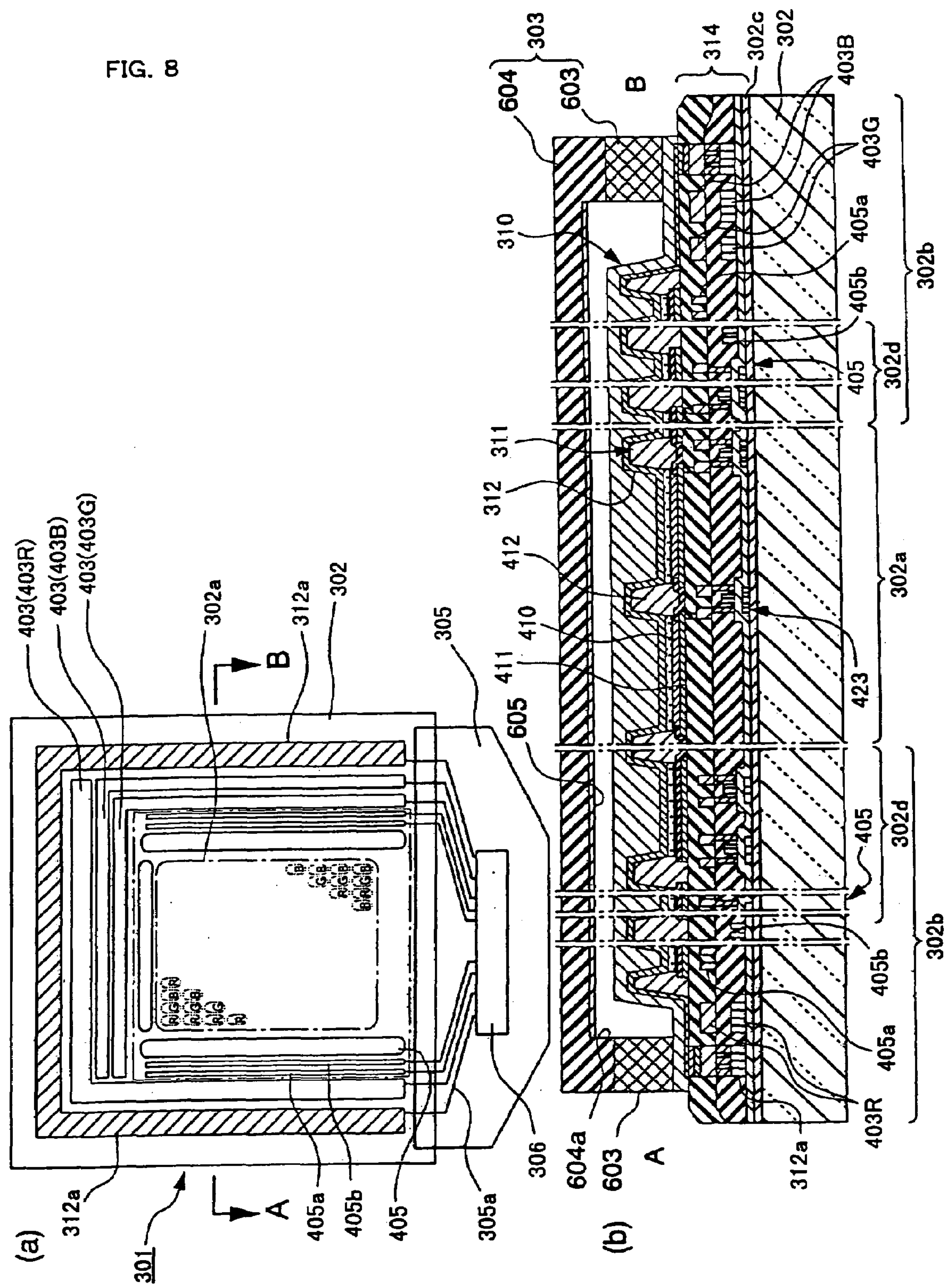
FIG. 8 shows a display device of the first embodiment of this invention, in which FIG. 8(*a*) is a schematic plan view of an electroluminescence display device, and FIG. 8(*b*) is a schematic cross-sectional view along line AB in FIG. 8(*a*)

Next, an electroluminescence (EL) display device is explained, as another example of an electro-optical device of this invention. FIG. 8 is a schematic plan view and schematic cross-sectional view of an EL display device of this embodiment.

The EL display device of this embodiment comprises a transparent substrate 32, of glass or similar material; light-emitting elements arranged in a matrix; and a sealing substrate.

4-1. Substrate

The substrate 302 is divided into a display area 302*a*, positioned at the center of the substrate 302, and a non-display area 302*b*, positioned on the outside of the display area 302*a* on the substrate 302.

The display area 302*a* is an area in which light-emitting elements are formed in a matrix, and is also called the effective display area. In the non-display area 302*b*, a dummy area 302*d*, adjacent to the display area 302*a*, is formed.

According to this embodiment, a functional layer is formed in the dummy area as well, so that the layer thickness in the pixels of the functional layer is uniform among pixels.

As a result, this EL display device 301 has a pixel light-emission characteristic that is substantially uniform among pixels, so that good-quality images can be displayed.

4-2. Circuit Elements

As shown in FIG. 8(*b*), a circuit element portion 314 is provided between the light-emitting element portion 311, comprising light-emitting elements and a bank portion, and the substrate 302. This circuit element portion 314 comprises scan lines, signal lines, hold capacitors, thin film transistors for switching, and driving thin film transistors 423.

4-3. Cathode

One end of the cathode 312 is connected to the cathode wire 312*a* formed on the substrate 302, and one end of this wire is connected to the wire 305*a* on the flexible substrate 305. The wire 305*a* is connected to a driving IC (driving circuit) 306 provided on the flexible substrate 305.

4-4. Power Supply Lines

As shown in FIG. 8(*a*) and FIG. 8(*b*), the power supply lines 403R, 403G, 403B are placed in the non-display area 302*b* of the circuit element portion 314.

4-5. Driving Circuits

On both sides of the display area 302*a* are placed scan line driving circuits 405, 405. These scan line driving circuits 405, 405 are provided within the circuit element portion 314 under the dummy area 302*d*. Also, a driving circuit control signal line 405*a* and driving circuit power supply line 405*b*, connected to the scan line driving circuits 405, 405, are provided within the circuit element portion 314.

4-6. Inspection Circuit

An inspection circuit (not shown) is placed within'the non-display area 302*b*. By means of this inspection circuit, inspections can be performed on the quality or defects of the display device during manufacturing or before shipment.

4-7. Sealing Portion

As shown in FIG. 8(*b*), a sealing portion 303 is provided on the light-emitting element portion 311. This sealing portion 303 comprises a sealing resin 603, applied to the substrate 302, and a sealing substrate 604. The sealing resin 603 is a thermo-hardening resin or an ultraviolet ray hardening resin or similar; in particular, it is desirable that the sealing resin be an epoxy resin which is a type of thermo-hardening resin.

The sealing substrate 604 is of glass or metal, and is joined to the substrate 302 via the sealing resin 603; inside of the sealing substrate 604 is formed a depression 604*a* which accommodates the display element 310. To the depression 604*a* is affixed a getter material 605 which absorbs water, oxygen and similar.

4-8. Overall Configuration of the Display Area

Figure 9:
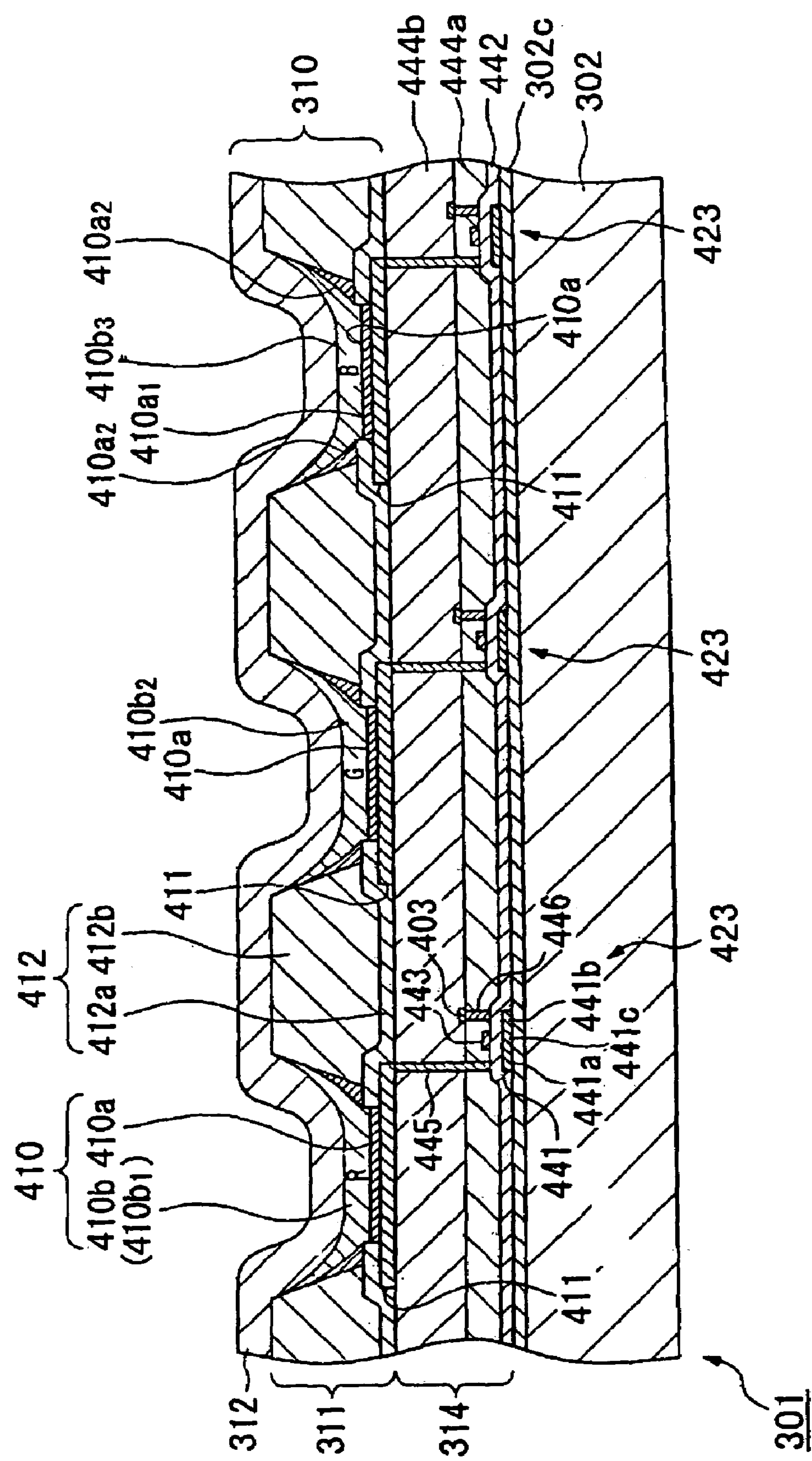
FIG. 9 is an enlarged view of the cross-sectional structure of the display area in the display device.

FIG. 9 is an enlarged view of the cross-sectional structure of the display area in a display device of this invention. In FIG. 9, three pixels are shown. The display device 301 comprises a circuit element portion 314, in which are formed TFTs and other circuits on the substrate 302, and a light-emitting element portion 311, in which is formed the functional layer 410, in sequential layers.

In this display device, light emitted from the functional layer 410 toward the side of the substrate 302 is emitted toward the lower side of the substrate 302, passing through the circuit element portion 314 and the substrate 302. Light emitted to the opposite side of the substrate 302 from the functional layer 410 is reflected by the cathode 312, passes through the circuit element portion 314 and the substrate 302, and is emitted toward the lower side of the substrate 302.

4-9. Circuit Element Portion

A base protective film 302*c*, comprising a silicon oxide film, is formed on the substrate 302 in the circuit element portion 314. On top of this base protective film 302*c* are formed island-shape semiconductor films 441 of polycrystalline silicon. In these semiconductor films 441, source areas 441*a* and drain areas 441*b* are formed by high-concentration P ion implantation. The portion in which P is not introduced is the channel area 441*c*.

In the circuit element portion 314, there is also formed a transparent gate insulator film 442 which covers the base protective film 302*c* and the semiconductor film 441, and on top of the gate insulator film 442 is formed a gate electrode 443 (scan line). On top of the gate electrode 443 and gate insulator film 442 are formed a transparent first interlayer insulation film 444*a* and a second interlayer insulation film 444*b*. The gate electrode 443 is provided in a position corresponding to the channel area 441*c* of the semiconductor film 441.

Also, contact holes 445, 446 are formed, penetrating the first and second interlayer insulation films 444*a*, 444*b*, and connected to the source and drain areas 441*a*, 441*b* respectively of the semiconductor film 441.

On top of the second interlayer insulation film 444*b* is formed a transparent pixel electrode 411 of ITO or similar, patterned in a prescribed shape; the contact hole 445 is connected to this pixel electrode 411.

The other contact hole 446 is connected to the power supply line 403.

In this way, a thin film transistor 423 connected to each of the pixel electrodes 411 is formed in the circuit element portion 314.

4-10. Light-Emitting Element Portion

The light-emitting element portion 311 principally comprises functional layers 410 each layered on top of each of the plurality of pixel electrodes 411; partitions 412, which separate each pixel electrode 41 and the functional layer 410 from neighboring pixel electrodes 411 and functional layers 410; and a cathode 312 formed on top of the functional layer 410. A light-emitting element comprises this pixel electrode (first electrode) 411, functional layer 410, and cathode (opposing electrode) 312.

Here the pixel electrode 411 is formed of, for example, ITO, and is patterned into substantially a rectangular shape as seen in a top view. It is desirable that the length of this pixel electrode 411 be in the range 50 nm to 200 nm; particularly around 150 nm. Partitions 412 are provided between each of the pixel electrodes 411.

The partitions 412 comprise a layering of an inorganic bank layer 412*a* (first bank layer), positioned on the side of the substrate 302, and an organic bank layer 412*b* (second bank layer), positioned at a distance from the substrate 302.

It is desirable that the inorganic bank layer 412*a* be of, for example, $SiO_2$, $TiO_2$, or some other inorganic material. It is desirable that the film thickness of the inorganic bank layer 412*a* be in the range 50 nm to 200 nm; particularly around 150 nm.

The organic bank layer 412*b* is formed of an acrylic resin, polyimide resin, or some other heat-resistant, solvent-resistant material. It is desirable that the thickness of the organic bank layer 412*b* be in the range from 0.1 μm to 3.5 μm; particularly around 2 μm.

4-11. Functional Layer

The functional layer 410 comprises a positive hole injection/transport layer 410*a* layered on top of the pixel electrode 411, and a light-emission layer 410*b* formed on the next to the positive hole injection/transport layer 410*a*.

The positive hole injection/transport layer 410*a* has a function for injecting positive holes into the light-emission layer 410*b*, and also has a function for transporting positive-holes in the interior of the positive hole injection/transport layer 410*a*. By providing such a positive hole injection/transport layer 410*a* between the pixel electrodes 411 and the light-emission layer 410*b*, the light-emission efficiency, lifetime, and other element characteristics of the light-emission layer 410*b* are improved. In the light-emission layer 410*b*, positive holes injected from the positive hole injection/transport layer 410*a* recombine in the light-emission layer with electrons injected from the cathode 312, to obtain light emission. In addition to the flat portions $\mathbf{410}a_1$ on the pixel electrodes 411, the positive hole injection/transport layer 410*a* may also have a peripheral portion $\mathbf{410}a_2$ formed along the partitions 412.

There are three types of light-emission layer 410*b*: a red light-emission layer 410$b_1$, emitting red light, a green light-emission layer 410$b_2$, emitting green light, and a blue light-emission layer 410$b_3$, emitting blue light; these are arranged, for example, in a stripe array.

4-12. Cathode

The cathode 312 is formed over the entire surface of the light-emission element portion 311, and, paired with the pixel electrodes 411, plays the role of passing a current to the functional layers 410. This cathode 312 comprises, for example, a stacking of a calcium layer and an aluminum layer.

Here, it is desirable that a material with a low work function be provided in the cathode on the side near the light-emission layer.

4-13. Modified Example

In the above-mentioned example, light emitted from the functional layer 410 is emitted to the lower side of the substrate 302 (so-called bottom emission). However, by using a transparent material as the cathode 312, it is also possible to emit light from the side of the cathode 312 (so-called top emission).

In this case, ITO, Pt, Ir, Ni, or Pd can be used as the transparent material. It is desirable that the film thickness be 75 nm, and still more desirable that the film thickness be thinner than this. There is no need for the substrate 302 to be of a transparent material. Also, highly reflective material is used in the pixel electrodes 411. When the pixel electrodes are anodes similarly to those described above, material with a high work function and high reflectivity, such as Cr, Fe, Co, Ni, Cu, Ta, W, or Au, is used in the pixel electrodes.

A protective film is formed on top of the cathode 312. In the case of top emission, it is desirable that the protective film be uniform, in order that the pixel light-emission characteristics be uniform among pixels. In this embodiment, dummy pixels are provided, so that the protective film is formed uniformly in the pixel formation area. Consequently light-emission characteristics are constant among pixels, and there is the advantage that satisfactory display is possible.

5. Plasma Display Device

Figure 10:
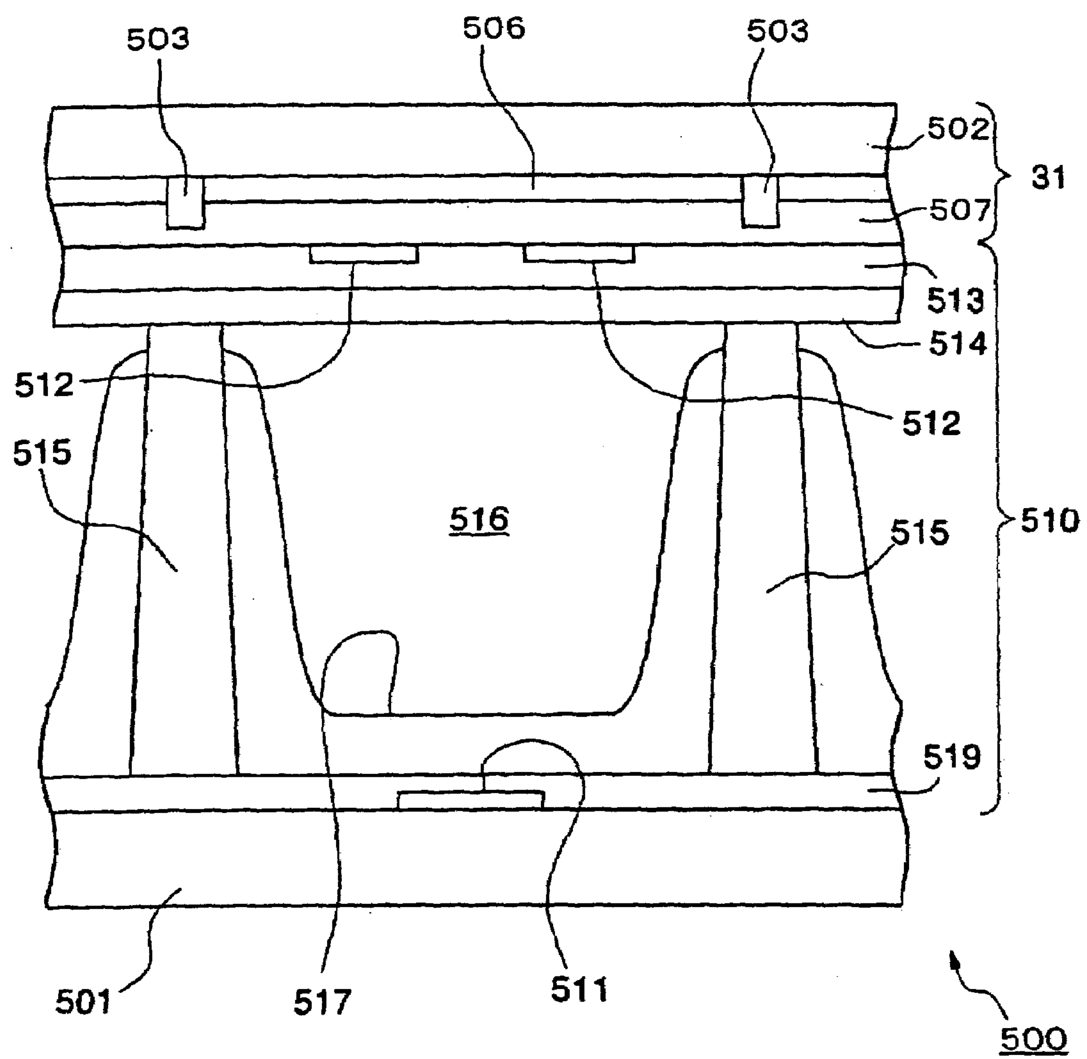
FIG. 10 shows a basic concept of a plasma-type display device, which is a display device of another embodiment of this invention.
Figure 11:
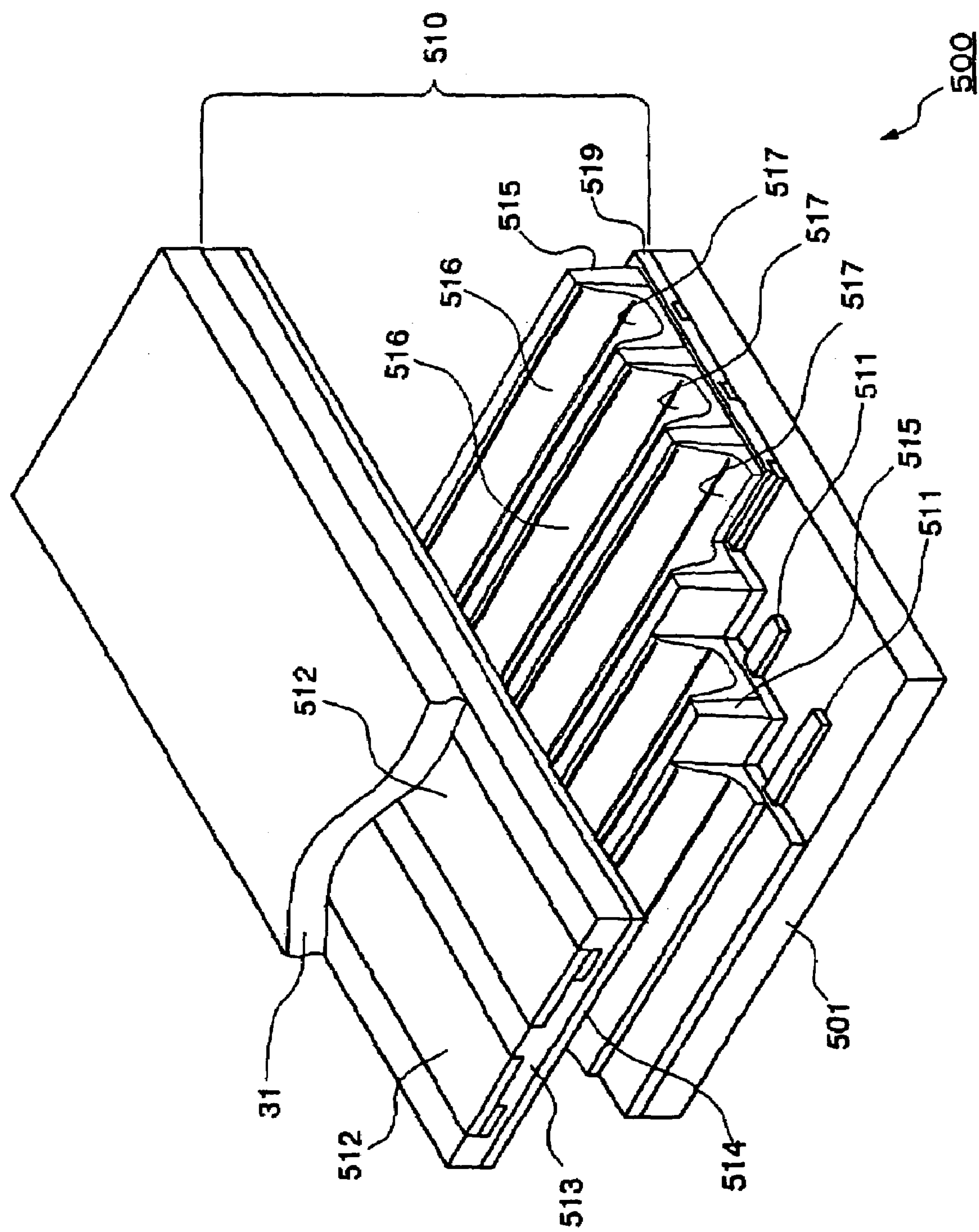
FIG. 11 is an exploded perspective view of a plasma-type display device; and, FIG. 12 is a perspective view showing an example of electronic equipment of this invention.

FIG. 10 shows the basic concept of a plasma-type display device, which is a display device of another embodiment of this invention, and FIG. 11 is an exploded perspective view of a plasma-type display device.

The display device 500 of this embodiment comprises a color filter similar to that of the preceding embodiment, and is configured with the color filter 31 positioned on the observation side. The display device 500 substantially consists of a glass substrate 501 and the color filter 31 facing with each other, as well as a discharge display portion 510 formed between them. The color filter 31 comprises partitions 503 and a coloring layer 506 formed on a substrate 502, as well as an overcoat layer 507 covering these.

In the discharge display portion 510, there are collected a plurality of discharge chambers 516. Among the discharge chambers 516, a set of three discharge chambers 516 form a single pixel. Hence each of the discharge chambers 516 is provided to correspond to each of the coloring portions of the color filter 31 stated above.

The address electrodes 511 are formed, in stripe shape at a prescribed interval, on the upper surface of the glass substrate 501, and a dielectric layer 519 is formed so as to cover the upper surfaces of these address electrodes 511 and the substrate 501. Barrier walls 515 are formed on this dielectric layer 519, positioned between the address electrodes 511, 511 and along each of the address electrodes 511. The barrier walls are partitioned, at the positions at prescribed intervals in the length direction, by lines perpendicular to the address electrodes 511 (not shown). In essence, rectangular areas are formed, partitioned by the barrier walls adjacent laterally to the address electrodes 511 and by barrier walls extending in the direction perpendicular to the address electrodes 511. Discharge chambers 516 are formed corresponding to these rectangular-shape areas. A fluorescent material 517 is formed on the inside of these rectangular areas divided by barrier walls 515.

Next, on the color filter 31, a plurality of display electrodes 512 are formed in a stripe shape and at a prescribed interval, in the direction perpendicular to the address electrodes 511 (in FIG. 10, for an illustration purpose, the direction of the address electrodes is different from the actual direction). A dielectric layer 513 is formed covering these display electrodes 512, and a protective film 514 of MgO or similar is formed as well.

The substrate 501 and the substrate 502 of the color filter 31 are then faced with each other, with the plurality of address electrodes 511 and the plurality of display electrodes 512 mutually perpendicular, and are bonded together. The spaces enclosed by the substrate 501, the barrier walls 515, and the protective film 514 formed on the color filter 31 are evacuated, and by introducing a rare-earth gas, discharge chambers 516 are formed. The display electrodes 512 formed on the color filter 31 are formed such that two electrodes are provided for each discharge chamber 516.

The address electrodes 511 and display electrodes are connected to an AC power supply, not shown. By permitting conduction to each of the electrodes, the fluorescent material in the discharge display portion at necessary positions is excited and made to emit white light. By this emitted light through the color filter 31, color display is possible.

6. Electronic Equipment

Next, specific examples of electronic equipment comprising the above-mentioned display devices are explained. This electronic equipment uses any one of the display devices of the above-mentioned embodiments as a display unit, so that drying and hardening of the coloring material is performed under uniform conditions among pixels, the film thickness of the coloring material in each pixel after drying and hardening is uniform among pixels, and images can be displayed with good image quality.

Figure 12:
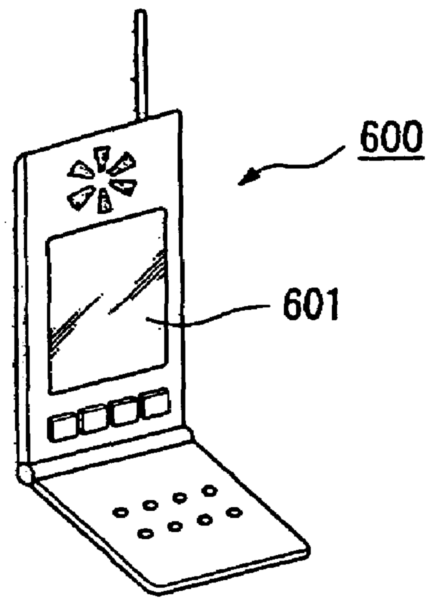
Figure 12:
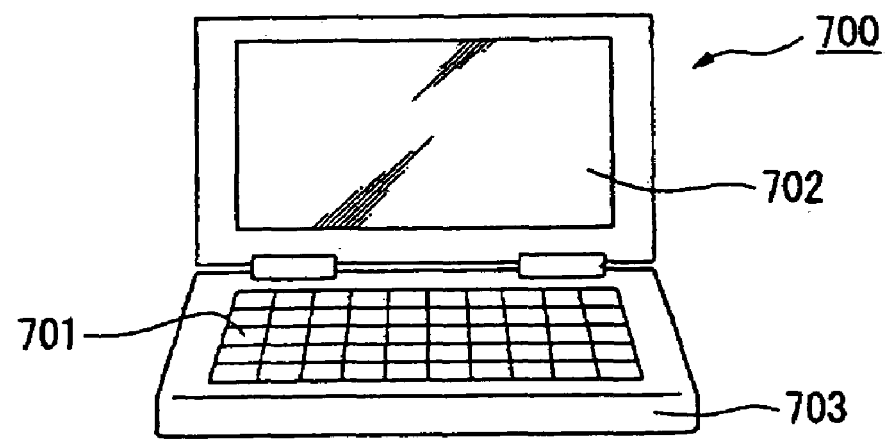
Figure 12:
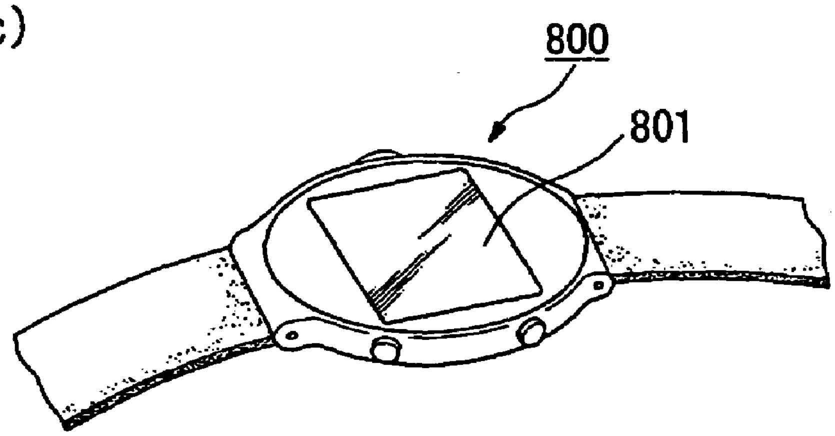

FIG. 12(*a*) is a perspective view showing one example of a portable telephone. The symbol 600 indicates a portable telephone set, and the symbol 601 indicates a display unit using one among the above-mentioned display devices.

FIG. 12(*b*) is a perspective view showing examples of a word processor, notebook computer, or other portable information processing equipment.

As shown in the figure, a display unit 702 using one of the above-mentioned display devices is provided in the information processing equipment 700. The information processing equipment 700 also comprises a keyboard or other input unit 701.

This information processing equipment 700 comprises an information processing equipment main unit 703, which in turn comprises a display signal generation portion. The display signal generation portion comprises various circuits such as a display information processing circuit and a clock generation circuit, as well as a power supply circuit to supply electric power to the above-stated various circuits. In the display device, display images are formed by supplying display signals generated by a display signal generation portion, based on information input for example from the input unit 701.

FIG. 12(*c*) is a perspective view showing one example of wristwatch-type electronic equipment. The symbol 800 indicates the watch main unit, and the symbol 801 indicates the display portion, using one of the above-mentioned display devices.

In order to manufacture this electronic equipment, a display device comprising a driver IC (driving circuit) is fabricated, and this display device is incorporated into the portable telephone, portable type information processing equipment, or wristwatch type electronic equipment.

Electronic equipment incorporating an electro-optical device of this embodiment is not limited to the above, but includes various other electronic equipment, such as electronic organizers, pagers, POS terminals, IC cards, mini-disc players, liquid crystal projectors, engineering workstations, television sets, viewfinder-type or monitor direct-view type videotape recorders, electronic calculators, car navigation equipment, devices comprising touch-screen panels, and game equipment.

INDUSTRIAL APPLICABILITY

By means of this invention, differences in the quality (volume, surface height, surface flatness, and similar) of liquid material after drying and hardening are suppressed, so that a color filter without color irregularities, color tone irregularities, or brightness irregularities can be provided. Also, by means of this invention, a color filter can be provided in which the protective film is made flat, so that the liquid crystal layer or similar formed above the protective film can be distributed uniformly.

What is claimed is:

1. An electro-optical device, comprising:

a plurality of coloring pixels which are separated from each other by partitions formed on a formation area of a substrate, said pixels including a first coloring layer having an amount of coloring material;

a plurality of dummy pixels separated from each other by the partitions; and a liquid crystal layer which selectively transmits light, each pixel of said liquid crystal layer corresponding to said coloring pixel, said dummy pixels including a second coloring layer having an amount of coloring material substantially the same as the amount of coloring material of the first coloring layer, the pixels being active display elements that contribute to an image display and having light transmittance characteristics that are substantially uniform among each of said coloring pixels, and the dummy pixels being inactive elements in the contributions to the image display.

2. The electro-optical device according to claim 1, said dummy pixels being formed in an area outside an area in which said coloring pixels are formed, and the amount of coloring material of each of said coloring pixels are formed, and the amount of coloring material of each of said dummy pixels being substantially the same as the amount of coloring material of said pixels.

3. The electro-optical device according to claim 2, each of said dummy pixels being formed with an aperture portion smaller than an aperture portion of each of said coloring pixels.

4. The electro-optical device according to claim 2, the amount of coloring material of said coloring pixels and the amount of coloring material of said dummy pixels being substantially the same per unit of said substrate.

5. The electro-optical device according to claim 1, said dummy pixels being formed in an area outside an area in which said coloring pixels are formed, the electro-optical device further comprising a protective film being formed so as to cover said pixels and said dummy pixels.

6. The electro-optical device according to claim 5, each of said dummy pixels being formed with an aperture portion smaller than an aperture portion of said coloring pixels.

7. The electro-optical device according to claim 5, said protective film being formed so as to also cover the area outside the formation area of said partitions.

8. The electro-optical device according to claim 5, said protective film being formed so as to adhere to an exposed area of the substrate outside the formation area of said partitions.

* * * * *